(12) United States Patent
Chou et al.

(10) Patent No.: US 10,049,942 B2
(45) Date of Patent: Aug. 14, 2018

(54) ASYMMETRIC SEMICONDUCTOR DEVICE AND METHOD OF FORMING SAME

(71) Applicant: GLOBALFOUNDRIES Inc., Grand Cayman (KY)

(72) Inventors: Anthony I. Chou, Beacon, NY (US); Judson R. Holt, Wappingers Falls, NY (US); Arvind Kumar, Beacon, NY (US); Henry K. Utomo, Newburgh, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/853,373

(22) Filed: Sep. 14, 2015

(65) Prior Publication Data

US 2017/0076991 A1  Mar. 16, 2017

(51) Int. Cl.
*H01L 21/265* (2006.01)
*H01L 21/266* (2006.01)
(Continued)

(52) U.S. Cl.
CPC .... *H01L 21/823814* (2013.01); *H01L 21/266* (2013.01); *H01L 21/26513* (2013.01);
(Continued)

(58) Field of Classification Search
CPC ........... H01L 29/66772; H01L 29/7812; H01L 29/7824; H01L 29/1041; H01L 29/1083; H01L 29/66045; H01L 29/66537; H01L 29/7833; H01L 29/6659; H01L 29/7836; H01L 29/66681; H01L 29/66757; H01L 29/66765; H01L 29/7816; H01L 29/66287; H01L 29/78618; H01L 29/6675; H01L 29/78672; H01L 29/41725; H01L 29/0843; H01L 29/7835; H01L 29/66575; H01L 29/66636; H01L 29/66628; H01L 29/1075; H01L 29/42312; H01L 29/78696; H01L 27/11857; H01L 27/0688; H01L 27/1211; H01L 27/11803; H01L 27/228; H01L 27/0617; H01L 27/085; H01L 27/0705; H01L 27/105; H01L 27/1203; H01L 27/1262; H01L 33/285; H01L 33/305; H01L 33/325; H01L 33/343;
(Continued)

(56) References Cited

U.S. PATENT DOCUMENTS

6,187,643 B1 * 2/2001 Borland ............ H01L 21/26586
257/E21.345
8,138,030 B2   3/2012 Chang et al.
(Continued)

*Primary Examiner* — Natalia Gondarenko
(74) *Attorney, Agent, or Firm* — Yuanmin Cai; Hoffman Warnick LLC (57) ABSTRACT

An aspect of the disclosure provides for an asymmetric semiconductor device. The asymmetric semiconductor device may comprise: a substrate; and a fin-shaped field effect transistor (FINFET) disposed on the substrate, the FINFET including: a set of fins disposed proximate a gate; a first epitaxial region disposed on a source region on the set of fins, the first epitaxial region having a first height; and a second epitaxial region disposed on a drain region on the set of fins, the second epitaxial region having a second height, wherein the first height is distinct from the second height.

11 Claims, 12 Drawing Sheets

(51) Int. Cl.
*H01L 29/167* (2006.01)
*H01L 29/78* (2006.01)
*H01L 21/8238* (2006.01)
*H01L 29/08* (2006.01)
*H01L 29/16* (2006.01)
*H01L 29/161* (2006.01)
*H01L 29/165* (2006.01)
*H01L 27/092* (2006.01)

(52) U.S. Cl.
CPC ........ *H01L 29/0847* (2013.01); *H01L 29/161* (2013.01); *H01L 29/165* (2013.01); *H01L 29/167* (2013.01); *H01L 29/1608* (2013.01); *H01L 29/7848* (2013.01); *H01L 21/823821* (2013.01); *H01L 27/0924* (2013.01)

(58) Field of Classification Search
CPC ............. H01L 27/1288; H01L 27/1274; H01L 21/2022; H01L 21/761; H01L 21/8232; H01L 21/02667; H01L 21/845; H01L 21/823418; H01L 21/26513; H01L 21/823821; H01L 21/266; H01L 29/7848; H01L 29/161; H01L 29/165; H01L 29/167; H01L 29/1608; H01L 29/66659; H01L 21/823814
USPC ....... 257/194, 347, 346, 345, 344, 343, 342, 257/336, 49, 61, 66, 67, 69, 213; 438/45, 438/142, 161, 222, 286, 300, 301, 302, 438/305, 306, 413, 416
See application file for complete search history.

(56) References Cited

U.S. PATENT DOCUMENTS

| | | | |
|---|---|---|---|
| 8,828,828 B2 | 9/2014 | Cheng et al. | |
| 8,969,932 B2 | 3/2015 | Wei et al. | |
| 2009/0014798 A1 | 1/2009 | Zhu et al. | |
| 2009/0221123 A1* | 9/2009 | Griebenow | H01L 21/26586 438/305 |
| 2010/0285650 A1* | 11/2010 | Shi | H01L 21/26586 438/286 |
| 2011/0049582 A1* | 3/2011 | Johnson | H01L 29/6653 257/288 |
| 2013/0049115 A1* | 2/2013 | Cheng | H01L 29/66803 257/347 |
| 2013/0249006 A1* | 9/2013 | Khakifirooz | H01L 27/088 257/368 |
| 2013/0320429 A1 | 12/2013 | Thomas | |
| 2014/0061801 A1* | 3/2014 | Doornbos | H01L 21/82380 257/351 |
| 2014/0252477 A1 | 9/2014 | Tseng et al. | |
| 2014/0264348 A1 | 9/2014 | Tsai et al. | |
| 2014/0284723 A1 | 9/2014 | Lee et al. | |
| 2014/0319624 A1 | 10/2014 | Chi et al. | |
| 2015/0056792 A1 | 2/2015 | Adam et al. | |
| 2015/0060960 A1 | 3/2015 | Xie et al. | |
| 2015/0079776 A1 | 3/2015 | Mukherjee et al. | |

* cited by examiner

ASYMMETRIC SEMICONDUCTOR DEVICE AND METHOD OF FORMING SAME

BACKGROUND

Technical Field

The present disclosure relates to an asymmetric semiconductor device, and more specifically, an asymmetric fin-shaped field effect transistor (FINFET) and methods of forming the same.

Related Art

Extrinsic resistance and fringing capacitances reduce the performance of FINFET devices. Epitaxial regions are disposed over sources and drain of FINFET devices. Typically, these epitaxial regions are of the same size (e.g., width and height). However, there is a tradeoff between device resistance and device capacitance based on the size of the epitaxial regions. Particularly, as epitaxial regions increase in size, there is a lower diffusion resistance but a higher diffusion capacitance. As epitaxial regions decrease in size, there is a higher diffusion resistance but a lower diffusion capacitance.

SUMMARY

A first aspect of the disclosure provides for an asymmetric semiconductor device. The asymmetric semiconductor device may comprise: a substrate; and a fin-shaped field effect transistor (FINFET) disposed on the substrate, the FINFET including: a set of fins disposed proximate a gate; a first epitaxial region disposed on a source region on the set of fins, the first epitaxial region having a first height; and a second epitaxial region disposed on a drain region on the set of fins, the second epitaxial region having a second height, wherein the first height is distinct from the second height.

A second aspect of the disclosure provides for a method of forming an asymmetric semiconductor device. The method may comprise: forming a fin-shaped field effect transistor (FINFET) on a substrate, the FINFET having a gate perpendicular to a set of fins, each fin having a source region and a drain region on opposing sides of the gate; and forming a first epitaxial region on the source region of each fin and a second epitaxial region on the drain region of each fin, wherein the first epitaxial region has a first height distinct from a second height of the second epitaxial region.

A third aspect of the disclosure provides for a method of forming an asymmetric semiconductor device. The method may comprise: forming a fin on a substrate; forming a gate stack perpendicular to the fin on the substrate; forming a pair of spacers, each spacer on opposing sides of the gate stack; forming a source region on one side of the gate stack and a drain region on an opposing side of the gate stack; and forming a first epitaxial region on the source and a second epitaxial region on the drain, wherein the first epitaxial region has a first height distinct from a second height of the second epitaxial region.

BRIEF DESCRIPTION OF THE DRAWINGS

The embodiments of this disclosure will be described in detail, with reference to the following figures, wherein like designations denote like elements, and wherein.

2

DETAILED DESCRIPTION

Aspects of the present disclosure provide for an asymmetric semiconductor device, and more particularly, an asymmetric fin-shaped field effect transistor (FINFET). It has been found that lower source resistance is more important for device performance than lower drain resistance, while lower gate-to-drain capacitance is more important for device performance than lower gate-to-source capacitance. As epitaxial regions increase in size, there is a lower source-drain resistance but a higher gate-to-source and higher gate-to-drain capacitance. As epitaxial regions decrease in size, there is a higher source-drain resistance but a smaller gate-to-source and lower gate-to-drain capacitance. Specifically, embodiments of the present disclosure provide for an epitaxial region over a source having a greater height than an epitaxial region over a drain, creating an asymmetrical structure. The asymmetric structure of the FINFET as described herein results in better device performance of the FINFET due to different optimization of extrinsic resistance and fringing capacitance on the source versus the drain.

Figure 1:
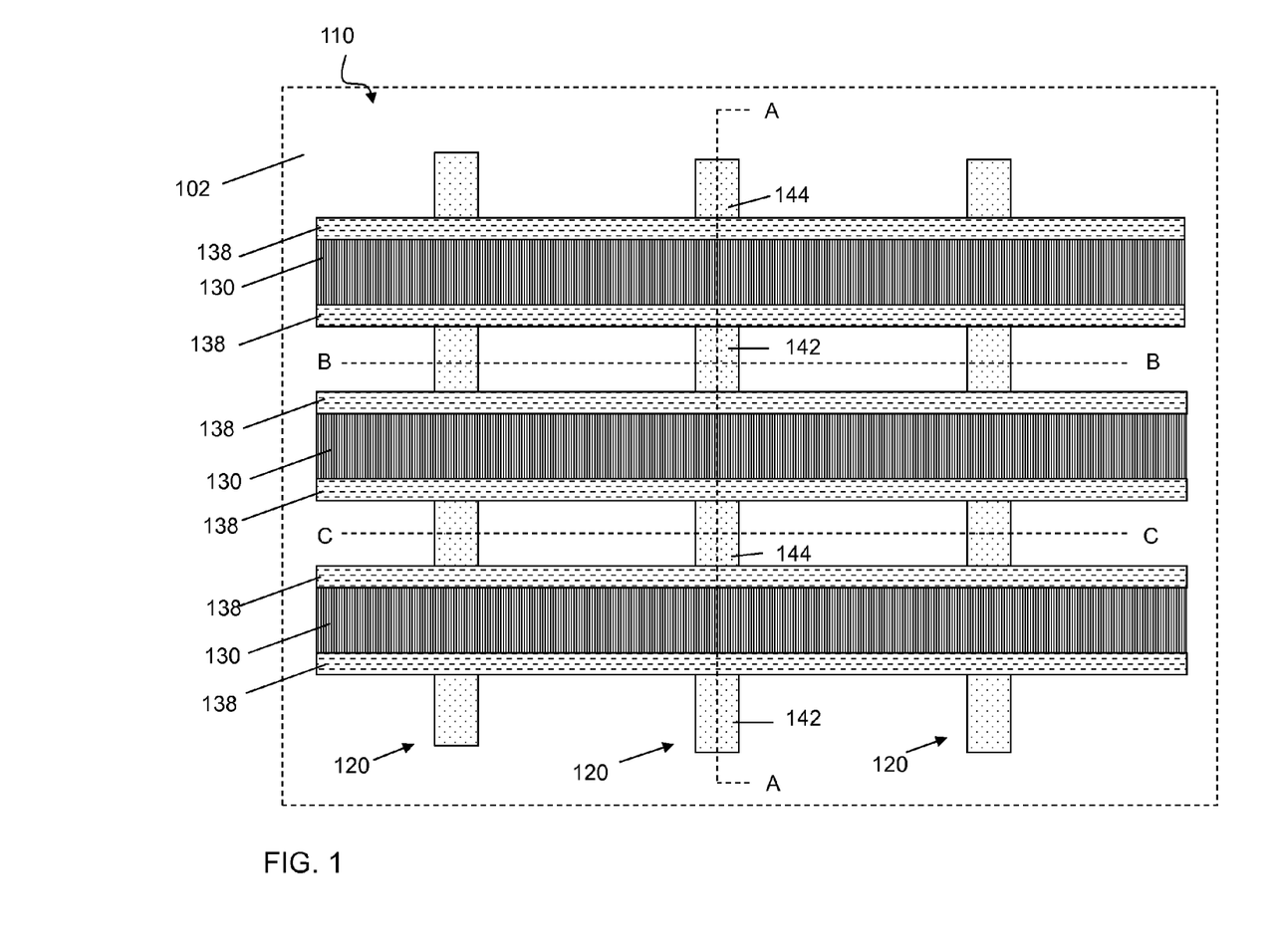
FIG. 1 shows a top view of a FINFET.
Figure 2:
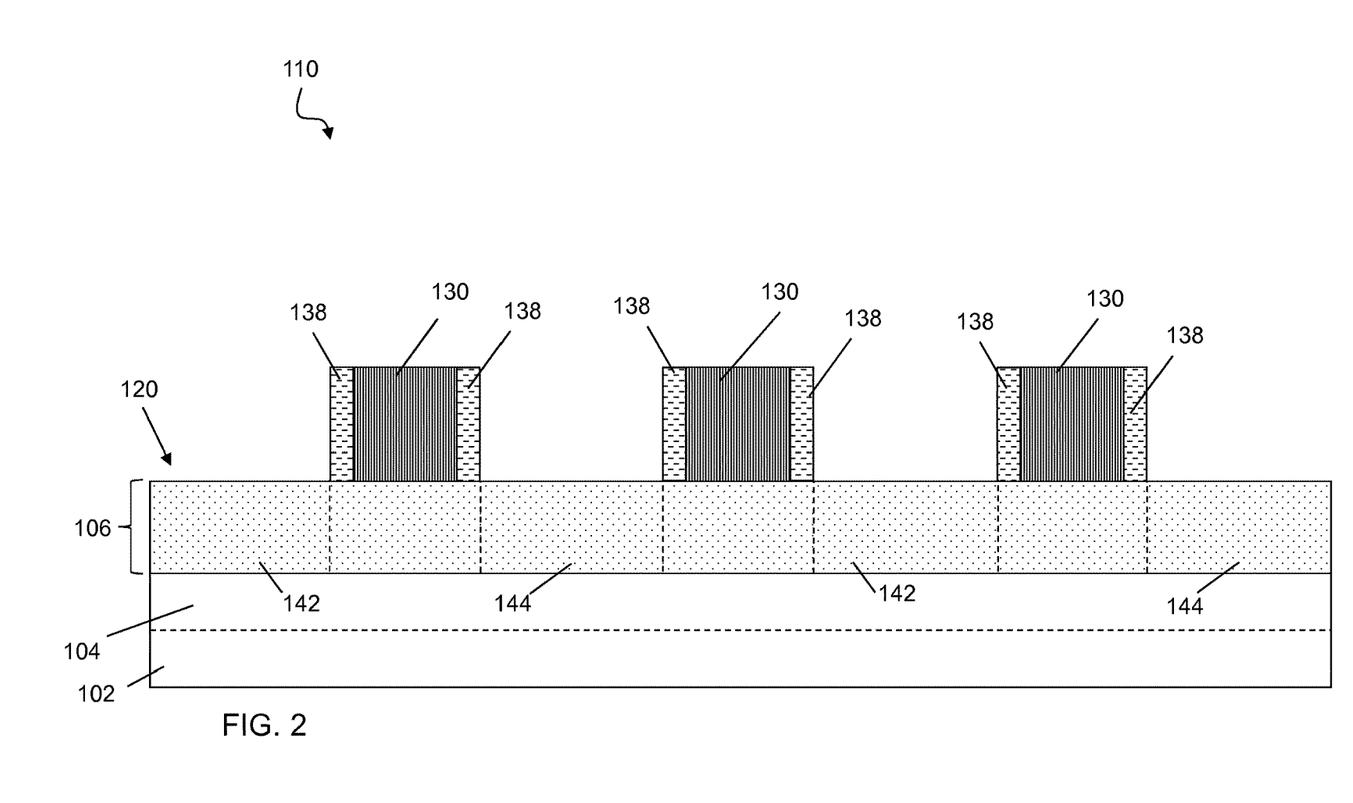
FIG. 2 shows a cross-sectional view of the FINFET of FIG. 1 taken along line A-A.

FIG. 1 shows a demonstrative illustration of a top view of a portion of a substrate 102 (e.g., a portion of an integrated circuit) (shown in phantom) including a FINFET 110 which includes a plurality of fins 120 perpendicular to and connected to gates 130. FIG. 2 shows a cross-section of FINFET 110 along line A-A of FIG. 1 (parallel to fin 120). A method for forming the asymmetric semiconductor device as will be described herein, may start by forming a FINFET 110 on a substrate 102. As will be described herein, FINFET 110 may have a plurality of gate stacks 130 perpendicular to a plurality of fins 120, and each fin may have a source 142 and drain 144.

FINFET 110 may be formed by any method known in the art. For example, FINFET 110 may be formed by forming a substrate 102. Substrate 102 can include any conventional semiconductor substrate material including but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 102 may be strained.

Overlying substrate 102 may be a buried oxide layer 104, which can be formed of any conventional oxide material, e.g., silicon dioxide ($SiO_2$). Overlying buried oxide layer 104 may be a silicon-on-insulator (SOI) layer 106, which can include silicon, silicon germanium, or any suitable semiconductor. SOI layer 106 can be formed over buried oxide layer 104, and buried oxide layer 104 can be formed over substrate 102, respectively, according to conventional SOI wafer formation techniques, e.g., wafer bonding or oxygen implantation, etc. prior to the processes described according to the various embodiments of the disclosure. It will be understood that when an element as a layer, region or substrate is referred as being "on" or "over" another element, it can be directly on the other element or intervening elements may be present. It will also be understood that when an element is referred to as being "connected" or "coupled" to another element, it can be directly connected or couple to the other element or intervening elements may be present. As used herein, and unless otherwise noted, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

A set of fins 120 may be formed over substrate 102 (and more particularly, over buried oxide layer 104). The set of fins 120 can be formed from SOI layer 106, e.g., via conventional etching and masking techniques known in the art and/or described herein. A gate stack 130 may be formed over the set of fins 120. Gate stack 130 will wrap around each fin 120 to form a tri-gate structure, which is known in the art. Gate stack 130 can include a gate dielectric (not shown), and a gate electrode (not shown) overlying the gate dielectric. Gate dielectric may include, but is not limited to: silicon dioxide, silicon oxynitrides, metal oxides, metal oxynitrides, metal silicon oxides, metal silicon oxynitrides, metal germanium oxides, metal germanium oxynitrides, and alloys, mixtures or multilayers of the same, where the metal may be selected from aluminum (Al), barium (Ba), beryllium (Be), bismuth (Bi), carbon (C), calcium (Ca), cerium (Ce), cobalt (Co), chromium (Cr), dysprosium (Dy), europium (Eu), iron (Fe), gallium (Ga), gadolinium (Gd), hafnium (Hf), indium (In), lanthanum (La), lithium (Li), magnesium (Mg), manganese (Mn), molybdenum (Mo), niobium (Nb), nickel (Ni), praseodymium (Pr), scandium (Sc), strontium (Sr), tantalum (Ta), titanium (Ti), vanadium (V), tungsten (W), yttrium (Y), zinc (Zn), and zirconium (Zr). Gate electrode may include, but is not limited to: poly-silicon, or a metal such as, tungsten (W), aluminum (Al) or combinations thereof or a fully silicided gate (FUSI). Gate stack 130 can be formed by any deposition technique known in the art and/or described herein. It is understood that gate stack 130 can act as an actual (final) gate stack in the gate-first process flow, or alternatively, as a dummy gate stack which is later replaced with an actual gate stack later in time (in a gate-last process flow).

Additionally, a spacer 138 may be formed over sidewalls of gate stack 130, leaving sidewalls and top of each fin 120 exposed. Spacers 138 can be formed by any deposition technique known in the art. Spacers 138 may include, but is not limited to: oxides or nitrides such as silicon nitride (SiN) or silicon dioxide ($SiO_2$).

An epitaxial region may be grown over each of the exposed fins 120. FINFET 110 may also include a source region 142 and drain region 144 on opposites of each gate stack 130 in each fin 120. That is, a source region 142 and a drain region 144 may alternate between each gate stack 130 of FINFET 110.

At this time, an epitaxial region may be grown over each of the exposed fins which include source regions 142 and drain regions 144. For NFET devices, the epitaxial source and drain regions may include, but are not limited to silicon (Si), silicon carbide (SiC) with carbon concentrations of approximately 0.1% to approximately 50%. As used herein "approximately" is intended to include values, for example, within 10% of the stated values. Additionally, the NFET epitaxial regions may be doped with n-type dopants such as phosphorus or arsenic. For PFET devices, the epitaxial source and drain regions may include, but are not limited to silicon (Si), silicon germanium (SiGe), with germanium concentrations varying from approximately 1% to approximately 50%. Additionally, the PFET epitaxial regions may be doped with p-type dopants such as boron or indium. However, conventional techniques result in the epitaxial region being of the same size on the source and drain regions (e.g., width and height). Aspects of the present disclosure include an asymmetric FINFET in which the epitaxial region over the source may have a height distinct from a height of the epitaxial region over the drain. Therefore, aspects of the present disclosure include forming a first epitaxial region 162 (FIG. 7) on source 142 of each fin 120 and a second epitaxial region 164 (FIG. 7) on drain 144 of each fin 120, wherein first epitaxial region 162 has a first height H1 (FIG. 7) which is distinct from a second height H2 (FIG. 7) of second epitaxial region 164.

Figure 3:
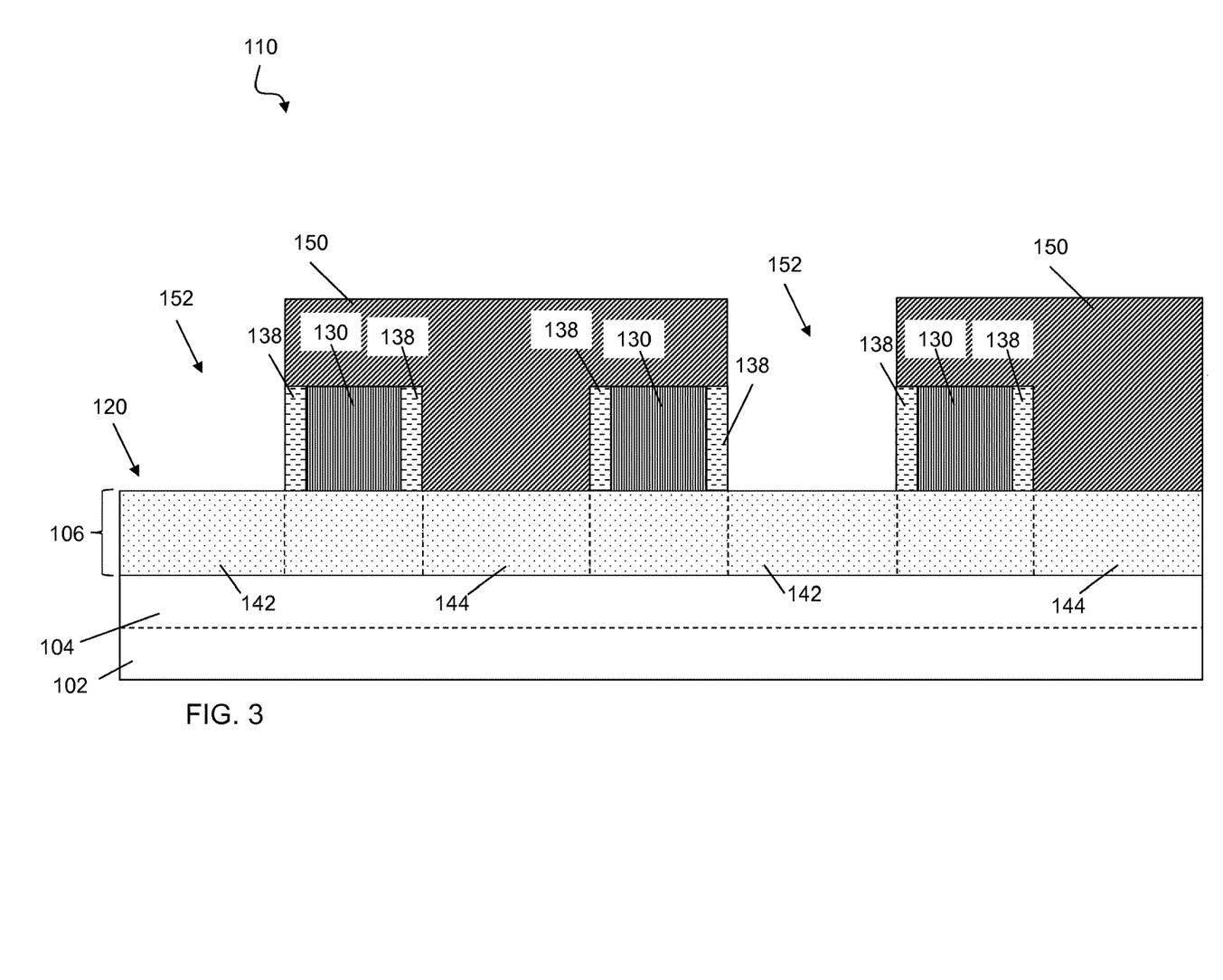
FIGS. 3-7 show cross-sectional views of FIG. 2 undergoing aspects of a method as described herein.
Figure 4:
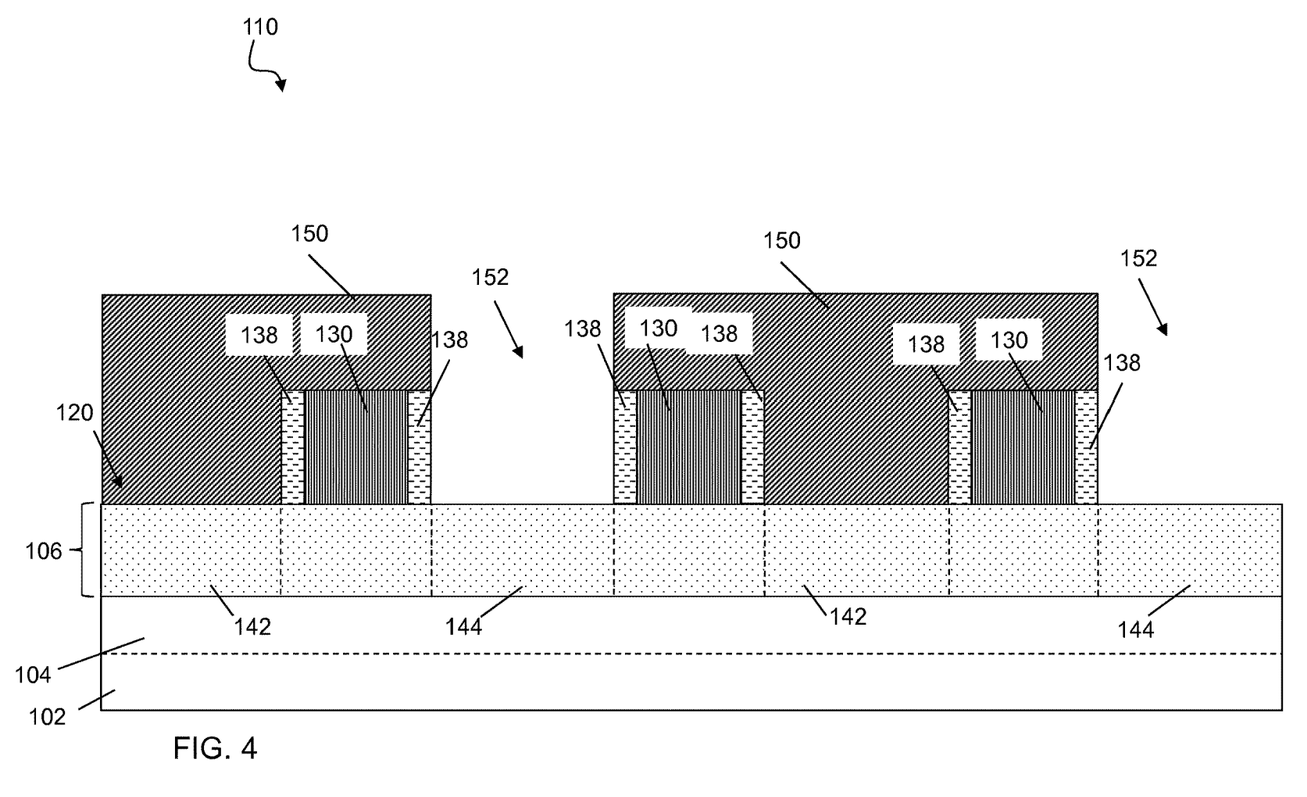

Referring to FIG. 3, forming first and second epitaxial regions 162, 164 (FIG. 7) may include, forming a mask that exposes a first region 152 of the set of fins 120. Forming the mask may include depositing a standard blanket photoresist mask 150 on FINFET 110 and patterning mask 150 to expose first region 152 of FINFET. As shown in FIG. 3, the mask may be formed to expose source 142. That is, exposing first region 152 may include exposing source 142. However, in another embodiment, as shown in FIG. 4, the mask may be formed to expose drain 144. That is, exposing first region 152 may include exposing drain 152.

Figure 5:
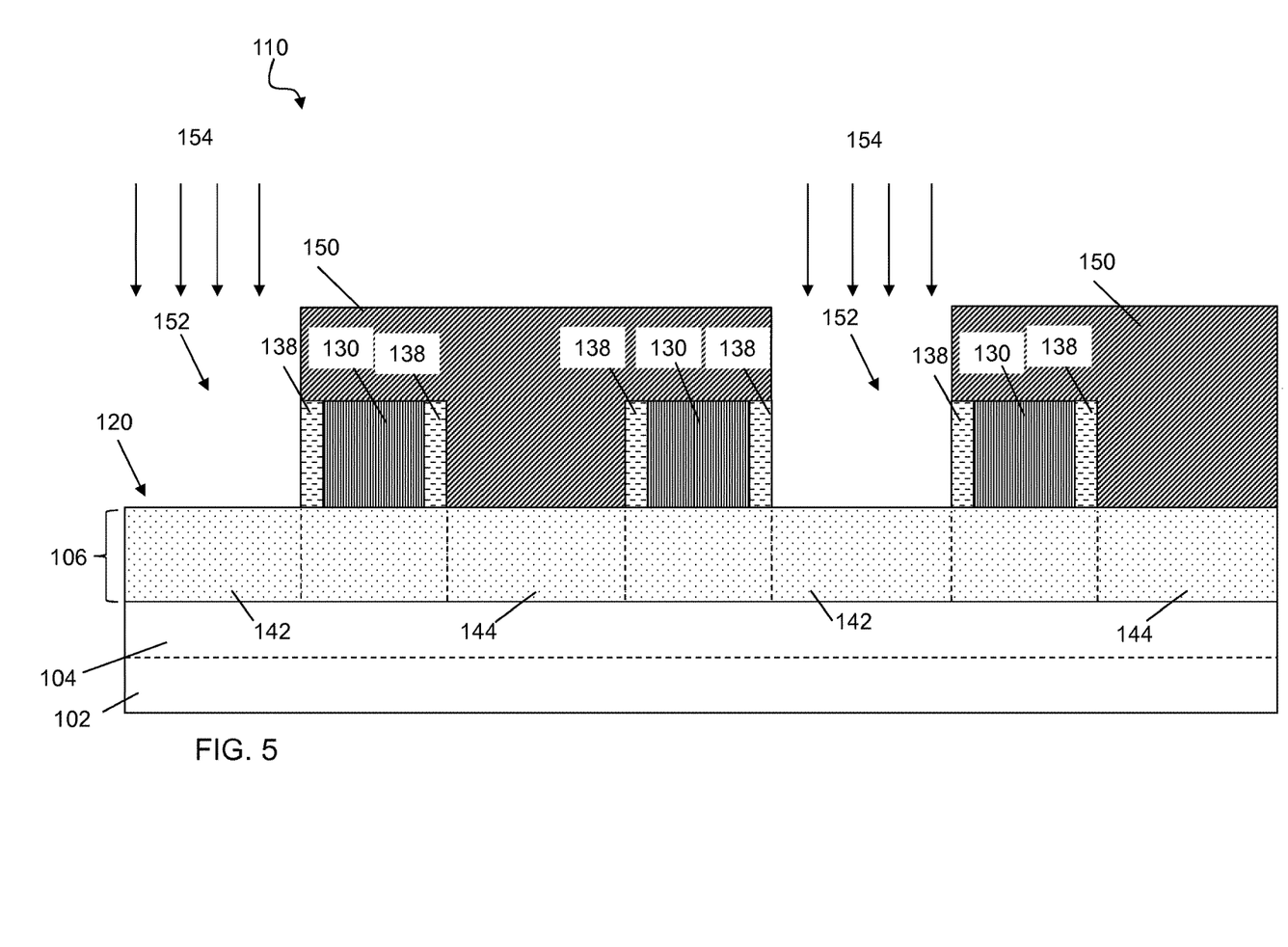
Figure 6:
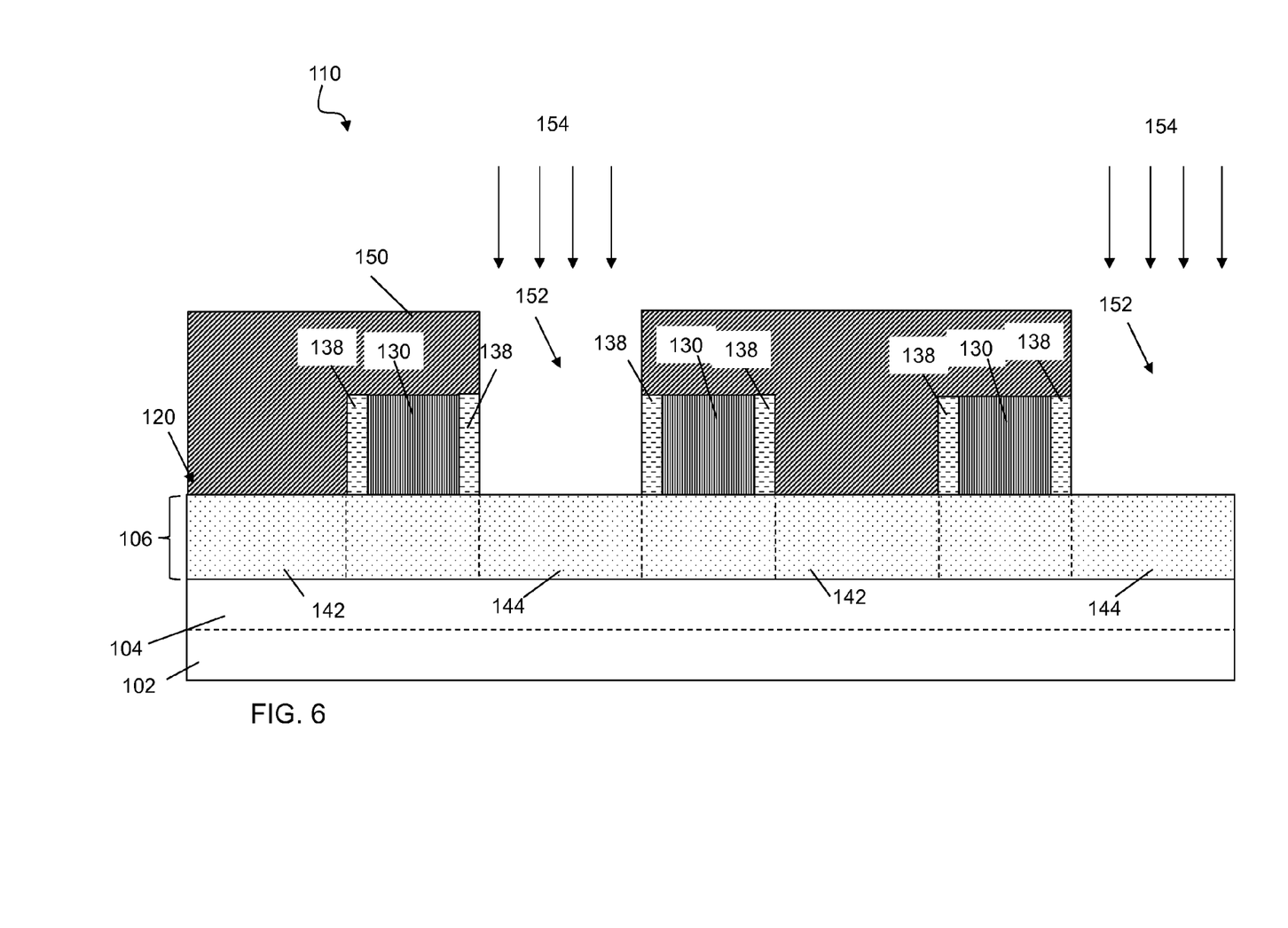

In either embodiment, a first material 154 may be introduced to first region 152 as shown in FIGS. 5-6. Referring to FIG. 5, first material 154 may be introduced to source 142. In this embodiment, first material 154 may be an accelerant for a subsequent epitaxial growth on top of source 142. That is, first material 154 may include any material which would accelerate the growth of an epitaxial region. First material 154 may be introduced by ion implantation such that source 142 is implanted with first material 154. For example, first material 154 may include germanium (Ge), xenon (Xe) or other species that damages the source region 142 when introduced by ion implantation. This ion implant damage can partially amorphize the source region 142, and when exposed to an elevated temperature of approximately 500° C. to approximately 1100° C., can recrystallize to form a polysilicon region which is known to accelerate the growth of a layer during epitaxial deposition. In this embodiment, gate stack 130, spacers 138, and drain 144 are covered by mask 152 and therefore, are not subjected to the implantation of first material 154.

Referring to FIG. 6, first material 154 may be introduced to drain 144. In this embodiment, first material 154 may be a retardant. That is, first material 154 may include any material which would retard the growth of an epitaxial region. For example, first material 154 may include boron (B) when growing PFET silicon germanium (SiGe) epitaxial regions because boron (B) slows silicon germanium (SiGe) epitaxial growth. First material 154 may include phosphorus (P) when growing NFET epitaxial regions, because phosphorus slows silicon (Si) epitaxial growth. First material 154 may be introduced by ion implantation such that drain 144 is implanted with first material 154. In this embodiment, gate stack 130, spacers 138, and source 142 are covered by mask 152 and therefore, are not subjected to the implantation of first material 154.

Figure 7:
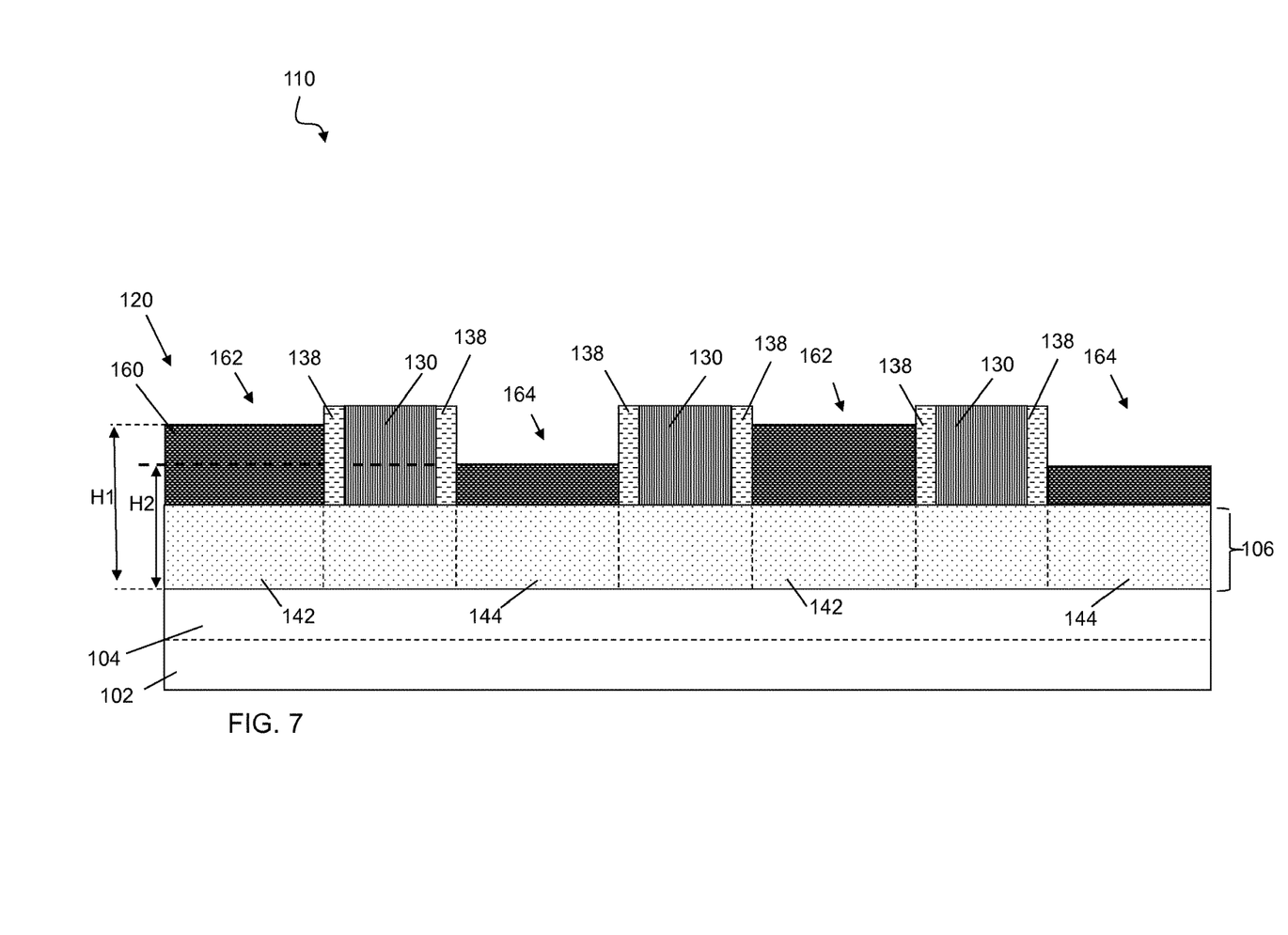
Figure 8:
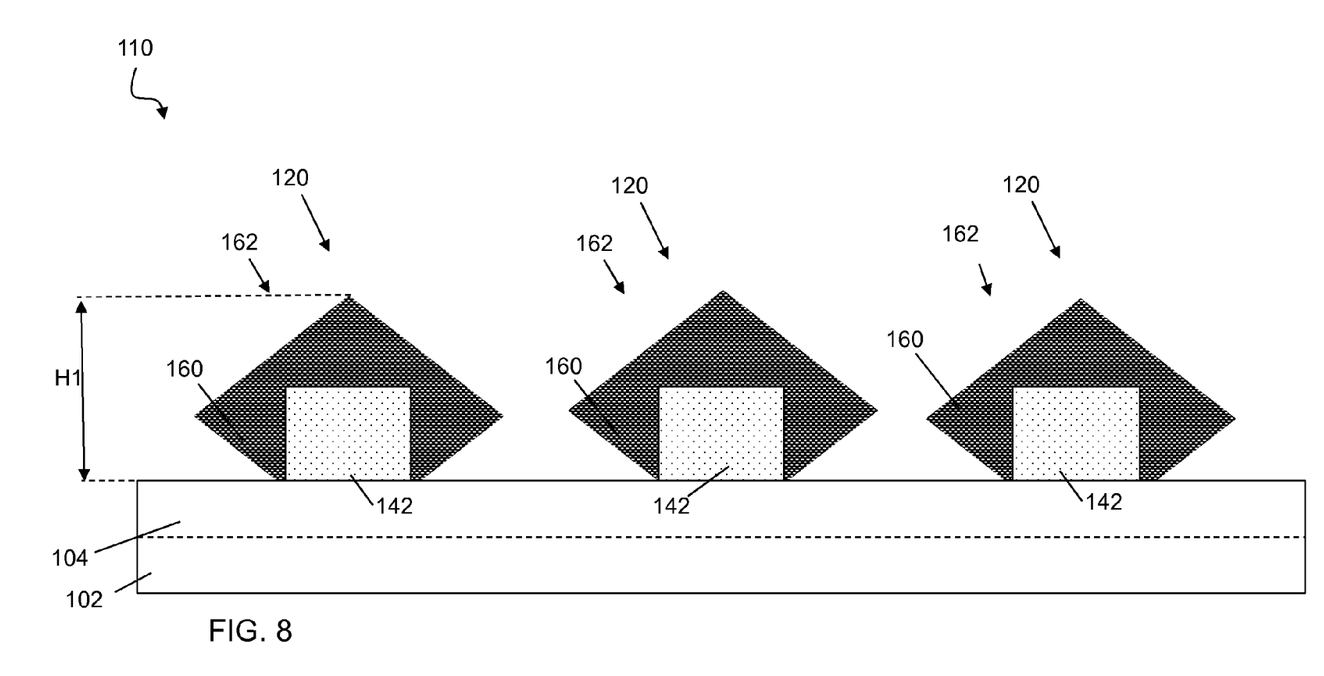
FIG. 8 shows a cross-sectional view of the FINFET of FIG. 1 taken along line B-B after undergoing aspects of the method as described herein.
Figure 9:
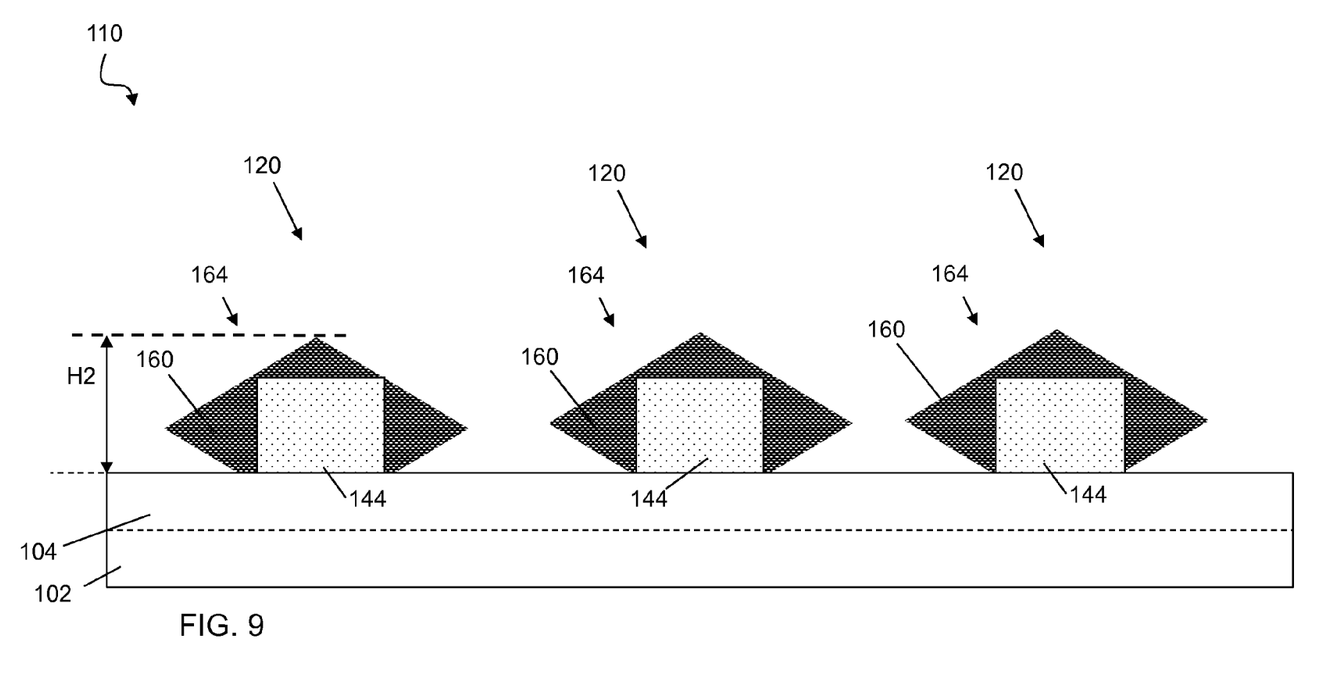
FIG. 9 shows a cross-sectional view of FINFET of FIG. 1 taken along line C-C after undergoing aspects of the method as described herein.

As shown in FIGS. 7-9, mask 150 may be removed and epitaxial regions 162, 164 may be formed. FIG. 7 shows the embodiment shown in FIG. 6 according to embodiments of the disclosure after formation of epitaxial regions 162, 164. FIGS. 8-9 show cross-sectional views of the embodiment shown in FIG. 7 taken perpendicular to fins 120 of FINFET 110 and between the gate stacks 130. The cross-sectional view of FIG. 8 is taken along line B-B, which is along the source region 142 of FINFET 110 of FIG. 1, after FINFET 110 has undergone aspects of the method described herein. The cross-sectional view of FIG. 9 is taken along line C-C, which is along the drain region 144 of FINFET 110 of FIG. 1, after FINFET 110 has undergone aspects of the method described herein. Epitaxial regions 162, 164 may be formed by epitaxially growing an epitaxial layer 160. Epitaxial layer 160 may include, but is not limited to: silicon (Si) for either NFETs and silicon (Si) or silicon germanium (SiGe) for PFETs. However, first epitaxial region 162, which is disposed over source 142, has a first height H1 and second epitaxial region 164, which is disposed over drain 144, has a second height H2. As used herein, "height" may refer to the distance from a portion of the epitaxial region that is closest to the substrate to a portion of the epitaxial region that is furthest from the substrate. First height H1 may be distinct from second height H2. First height H1 may be greater than second height H2. For example, first height H1 may be equal to approximately 30 nanometers (nm) to approximately 70 nm. More particularly, first height H1 may be approximately 50 nm. Second height H2 may be equal to approximately 20 nm to approximately 60 nm. More particularly, first height H1 may be approximately 40 nm. First epitaxial region 162 may have a greater height due to either source 142 being implanted with an accelerant while drain 144 was not, or drain 144 being implanted with a retardant while source 142 was not. That is, regardless of whether an accelerant was implanted in source 142 or a retardant was implanted in drain 144, epitaxial layer 160 will grow at a faster rate in first epitaxial region 162 than in second epitaxial region 164 resulting in a greater height H1. Thus, FINFET 110 is said to be asymmetrical due to the non-uniform heights H1, H2 of epitaxial regions 162, 164. Therefore, the resulting structure, as shown in FIG. 7, may include a FINFET 110 disposed on a substrate 102 (and more particularly, buried oxide layer 104). FINFET may include a set of fins 120 disposed proximate a gate stack 130, a first epitaxial region 162 disposed on a source 142 of the set of fins 120, and a second epitaxial region 164 disposed on a drain 144 of the set of fins 120 wherein first epitaxial region 162 has a first height H1 distinct from a second height H2 of second epitaxial region 164.

Figure 10:
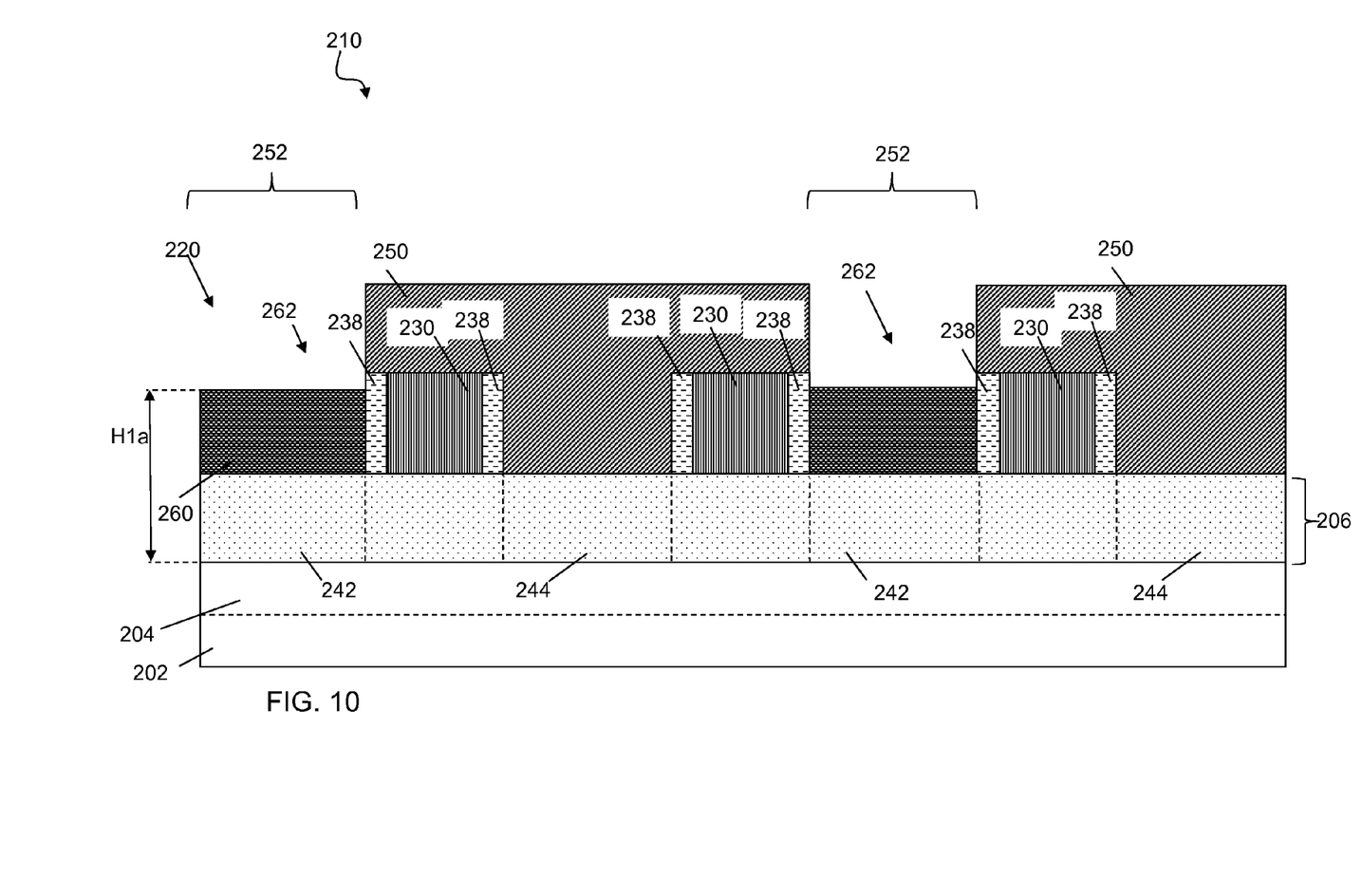
FIGS. 10-12 show the cross-sectional views of FIG. 2 undergoing aspects of another method as described herein.

Another aspect of the disclosure will now be described with reference to FIGS. 10-12. As shown in FIG. 10, a FINFET 210 may be formed as known in the art. For example, FINFET 210 may be formed as described with reference to FIGS. 1-2. As shown in FIG. 10, FINFET 210 may include a set of fins 220 from SOI layer 206 on a substrate 202 (and more particularly, buried oxide layer 204), a gate stack 230 perpendicular to and overlapping with set of fins 220, and spacers 238 disposed on opposite sides of gate stack 230. Additionally, a source 242 and a drain 244 of each fin 220 may be disposed on opposite sides of gate stack 230.

Additionally, aspects of the disclosure according to this embodiment provide for forming a first epitaxial region 262 on source 242 of each fin 220 and a second epitaxial region 264 (FIG. 11) on drain 244 of each fin 220, wherein first epitaxial region 262 has a first height H1$a$ which is distinct from a second height H2$a$ (FIG. 11) of second epitaxial region 264. Epitaxial regions 262, 264 may be formed by epitaxially growing an epitaxial layer 260. As shown in FIG. 10, forming first and second epitaxial regions 262, 264 may include forming a first mask 250 on FINFET 210. Forming the first mask may include, forming a first mask 250 on FINFET 210 and patterning first mask 250 to expose a first region 252 of the set of fins 220. As shown in FIG. 10, first region 252 may include source 242. Once first region 252 is exposed, first epitaxial region 262 may be grown on source 242. First epitaxial region 262 may be epitaxially grown as known in the art. First epitaxial region 262 may be grown to a first height H1$a$. First height H1$a$ may be substantially equal to approximately 30 nm to approximately 70 nm, or more particularly, approximately 50 nm.

Figure 11:
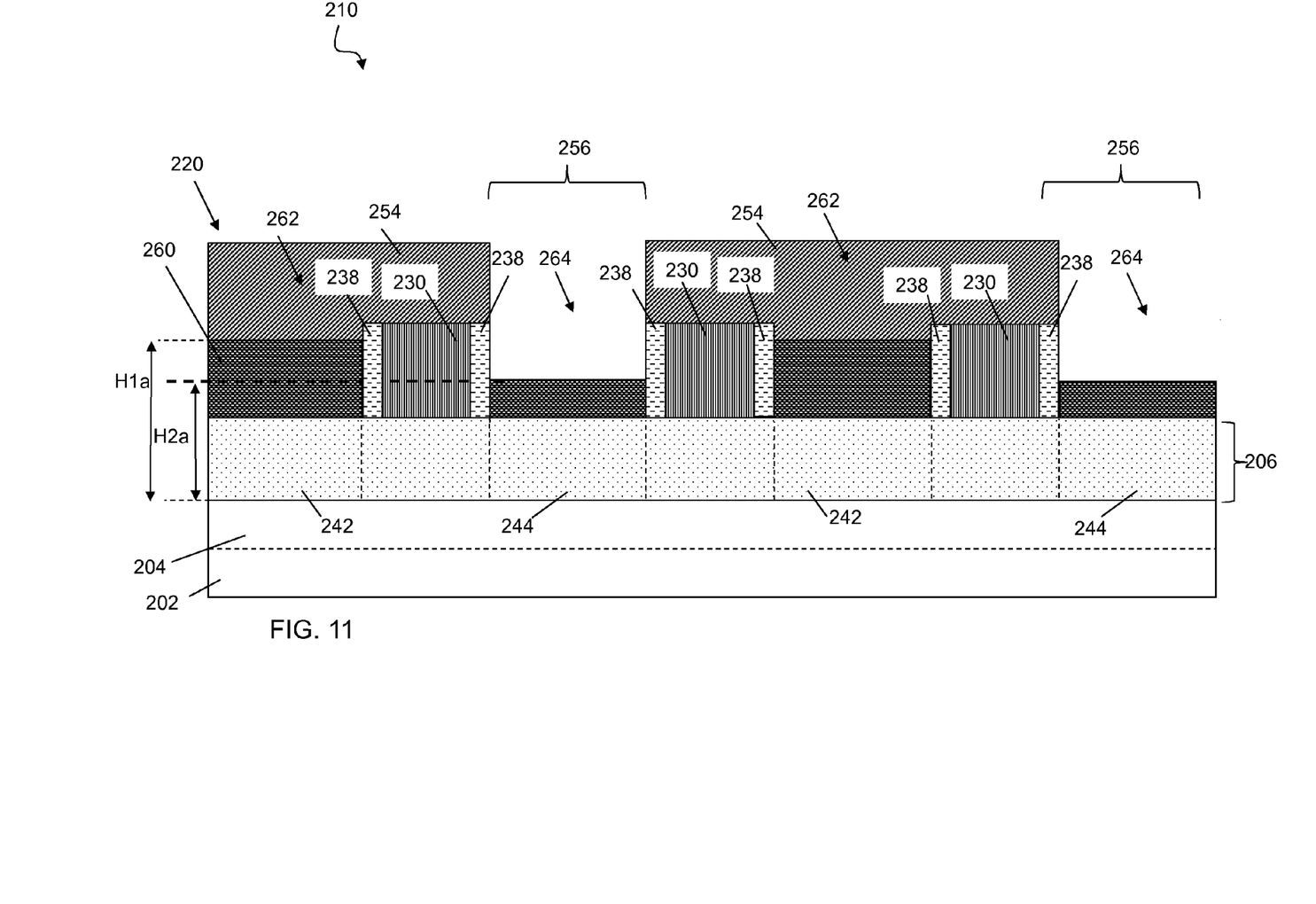
Figure 12:
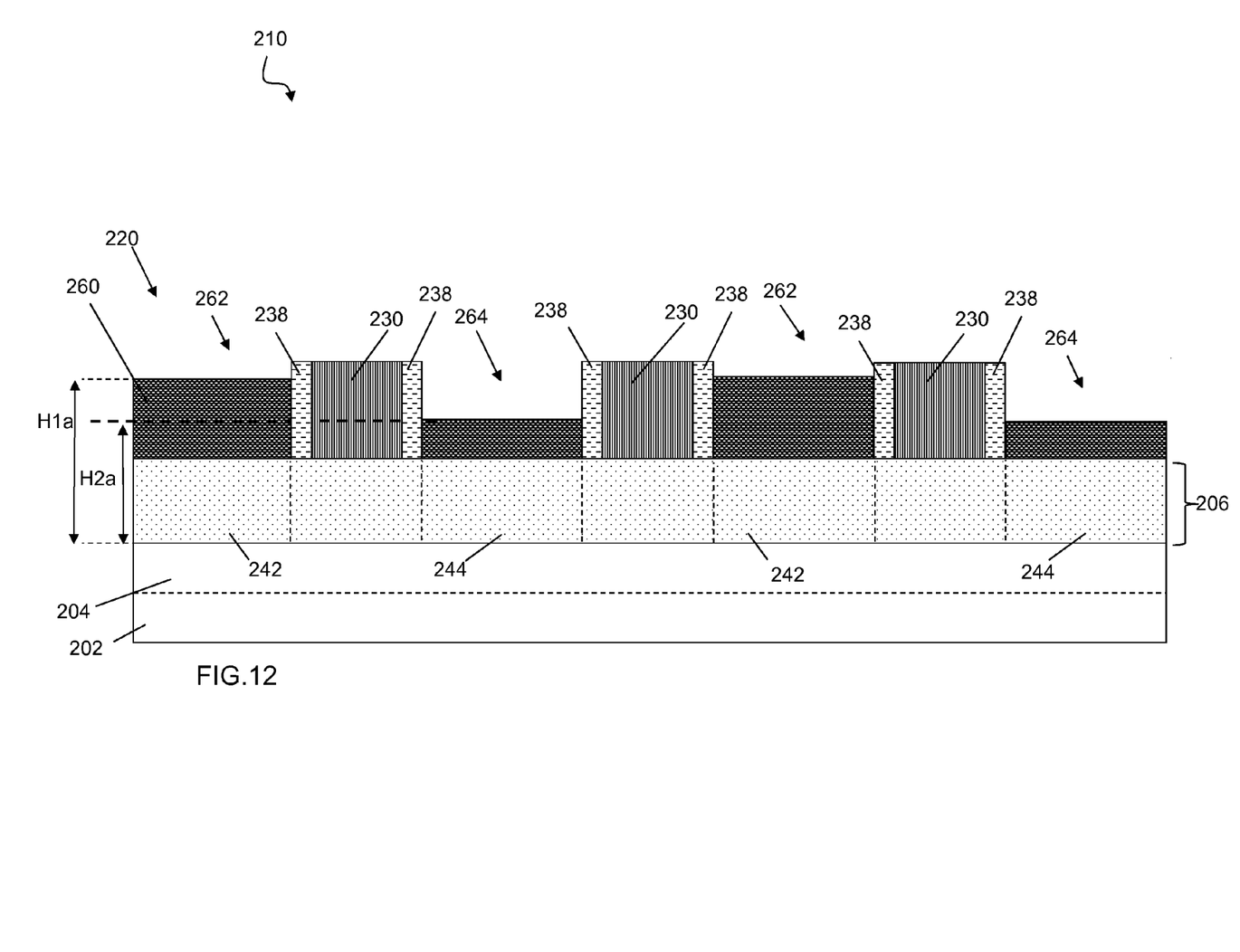

Once first epitaxial region 262 is formed, first mask 250 may be removed and a second mask 254 may be formed as shown in FIG. 11. Forming the second mask may include forming a second mask 254 over FINFET 210 and patterning second mask 254 to expose a second region 256 of FINFET 210. As shown in FIG. 11, second region 256 may include drain 244. Once second region 256 is exposed, second epitaxial region 264 may be grown on drain 244. Second epitaxial region 264 may be epitaxially grown as known in the art. Second epitaxial region 264, however, may be grown to a second height H2$a$. Second height H2$a$ may be equal to approximately 20 nm to approximately 60 nm, or more particularly, approximately 40 nm. In any event, second height H2$a$ is less than first height H1$a$ As shown in FIG. 12, mask 254 may be removed. Therefore, the resulting structure may include a FINFET 210 disposed on a substrate 202 (and more particularly, buried oxide layer 204). FINFET 210 may include a set of fins 220 disposed proximate a gate stack 230, a first epitaxial region 262 disposed on a source 242 of the set of fins 220, and a second epitaxial region 264 disposed on a drain 244 of the set of fins 220. First epitaxial region 262 may have a first height H1$a$ distinct from a second height H2$a$ of second epitaxial region 264.

It is to be understood in an alternative embodiment (not shown), which is similar to that described with reference to FIGS. 9-12, the first mask may be formed such that drain 244 is exposed instead of source 242, and second mask may be formed such that source 242 is exposed instead of drain 244. In this embodiment, epitaxial region 264 over drain may be grown to a first height that is smaller than a growth of epitaxial region 262 over source. However, in either embodiment, source 242 will have a height H1$a$ greater than H2$a$. That is, whichever order the masking steps are employed, the epitaxial growth of first epitaxial region 262 over source 242 will be such that first epitaxial region 262 is of a greater height H2$a$ than second epitaxial region 264.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an asymmetric semiconductor device, the method comprising:
    forming a having fin-shaped field effect transistor (FINFET) on a substrate, the FINFET having a first gate, a second gate, and a third gate, wherein each gate is disposed over and extends perpendicular to a set of fins, wherein each fin has source regions and drain regions alternating between adjacent gates such that a single source region is disposed between the first gate and the second gate, and a single drain region is disposed between the second gate and the third and
    forming a first epitaxial region on the single source region of each fin and a second epitaxial region on the single drain region of each fin, wherein the first epitaxial region has a height greater than a height of the second epitaxial region,
    wherein the forming the first epitaxial region and the second epitaxial region includes:
        patterning a first mask over the set of fins and the second gate such that one of the single source region and the single drain region is exposed, while the second gate and other one of the single source region and the single drain region are covered by the mask; and
        growing an epitaxial layer over both of the single source region and the single drain region to form the first epitaxial region and the second epitaxial region.

2. The method of claim 1, wherein the forming the first epitaxial region and the second epitaxial region further includes:
    after the patterning of the first mask, and before the growing the epitaxial layer:
    introducing a first material to the exposed one of the single source region and the single drain region; and
    removing remaining portions of the first mask from the second gate and the other one of the single source region and the drain region.

3. The method of claim 2, wherein:
    the patterning of the first mask includes exposing the single drain region, and
    the introducing of the first material includes introducing a retardant to the single drain region.

4. The method of claim 2, wherein:
    the patterning of the first mask includes exposing the single source region, and
    the introducing of the first material includes introducing an accelerant to the single source region.

5. A method forming an asymmetric semiconductor device, the method comprising:
    forming a fin on a substrate;
    forming a set of gate stacks perpendicular to the fin on the substrate, the set of gate stacks including a first gate stack, a second gate stack, and a third gate stack;
    forming a pair of spacers on opposing sides of each gate stack of the set of gate stacks;
    forming source regions and drain regions within the fin on opposing sides of each gate stack such that that the source regions and the drain regions alternate between adjacent gate stacks, wherein a single source region is disposed between the first gate and the second gate, and a single drain region is disposed between the second gate and the third gate; and
    forming a first epitaxial region on the source regions and a second epitaxial region on the drain regions, wherein the first epitaxial region has a height that is greater than a height of the second epitaxial region,
    wherein the forming the first epitaxial region and the second epitaxial region includes:
        patterning a first mask over the fin and the set of gate stacks such that one of the single source region and the single drain region is exposed, while the second gate stack and other one of the single source region and the single drain region are covered by the first mask;
        introducing a first material into the exposed one of the single source region and the single drain region without introducing the first material into the other one of the single source region and the single drain region; and
        growing an epitaxial layer over the one of the single source region and the single drain region having the first material therein and the other one of the single source region and the single drain region free of the first material therein to form the first epitaxial region and the second epitaxial region.

6. The method of claim 5, wherein the forming of the first epitaxial region and the second epitaxial region further includes:
    removing the first mask from the second gate stack and the other one of the single source region and the single drain region.

7. The method of claim 5, wherein:
    the forming the first mask includes exposing the single drain region, and
    the introducing of the first material includes introducing a retardant to the single drain region.

8. The method of claim 5, wherein:
    the forming the first mask includes exposing the single source region, and
    the introducing of the first material includes introducing an accelerant to the single source region.

9. The method of claim 5, wherein the introducing the first material includes performing ion-implantation.

10. The method of claim 1, wherein the forming of the first epitaxial region and the second epitaxial region further includes introducing a material into only one of the single source region or the single drain region to accelerate growth of the first epitaxial region on the single source region or to retard growth of the second epitaxial region over the single drain region, respectively.

11. The method of claim 5, wherein the forming of the first epitaxial region and the second epitaxial region further includes introducing a material into only one of the single source region or the single drain region to accelerate growth of the first epitaxial region on the single source region or to retard growth of the second epitaxial region over the single drain region, respectively.

* * * * *